(12) United States Patent
Gao

(10) Patent No.: US 12,033,877 B2
(45) Date of Patent: Jul. 9, 2024

(54) VENTILATED WAFER CASSETTE

(71) Applicant: BEIJING TONGMEI XTAL TECHNOLOGY CO., LTD., Beijing (CN)

(72) Inventor: Wei Gao, Fremont, CA (US)

(73) Assignee: Beijing Tongmei Xtal Technology Co., Ltd., Beijing (CN)

( * ) Notice: Subject to any disclaimer, the term of this patent is extended or adjusted under 35 U.S.C. 154(b) by 174 days.

(21) Appl. No.: 17/696,992

(22) Filed: Mar. 17, 2022

(65) Prior Publication Data

US 2022/0415684 A1    Dec. 29, 2022

(30) Foreign Application Priority Data

Jun. 25, 2021  (CN) .......................... 202121430104.8

(51) Int. Cl.
  *H01L 21/673* (2006.01)
(52) U.S. Cl.
  CPC .............................. *H01L 21/67389* (2013.01)
(58) Field of Classification Search
  CPC ........ H01K 21/67389; H01K 21/67369; H01L 21/67389; H01L 21/67369
  USPC ......................................... 206/711, 710, 454
  See application file for complete search history.

(56) References Cited

U.S. PATENT DOCUMENTS

| 7,648,041 B2 * | 1/2010 | Ueda ................. | H01L 21/67126 |
| | | | 220/323 |
| 8,528,738 B2 * | 9/2013 | Wiseman .......... | H01L 21/67369 |
| | | | 206/711 |

* cited by examiner

*Primary Examiner* — Javier A Pagan
(74) *Attorney, Agent, or Firm* — Clements Bernard Walker; Christopher L. Bernard

(57) ABSTRACT

A ventilated wafer cassette is provided. The cassette comprises an upper box, a lower box, and an inner box, wherein the upper box is fitted on the lower box to form a hollow structure, in which the inner box is disposed. At least one ventilation channel connecting the hollow structure with an external environment is provided in the upper box, in the lower box or at the connection between the upper box and the lower box. The ventilated wafer cassette of the present application can ensure gas exchange during the gas protection process conducted on semiconductor wafers, thereby preventing deformation of the wafer cassette due to pressure differences. Preferably, the interior of the ventilation channel is provided with a dustproof labyrinth structure, thereby preventing the entry of dust.

2 Claims, 6 Drawing Sheets

VENTILATED WAFER CASSETTE

PRIORITY CLAIM

The present application claims the benefit of Chinese Application 202121430104.8 filed on Jun. 25, 2021, the contents of which are hereby incorporated by reference.

TECHNICAL FIELD

The present application relates to a ventilated wafer cassette, and more particularly to a ventilated wafer cassette for semiconductor wafers and having a dustproof function.

BACKGROUND

In semiconductor wafer manufacturing industry, a wafer cassette is a common container component for containing semiconductor wafers. During the production of semiconductor wafers, it is required to apply gas protection to the semiconductor wafers at appropriate steps. In prior art, a method for applying gas protection to semiconductor wafers mainly includes the following steps: firstly placing a wafer cassette together with a semiconductor wafer into a packaging bag, and subsequently vacuuming the packaging bag; then inflating the packaging bag with protective gas (nitrogen, noble gas, etc.). This operation effectively replaces the air around the semiconductor wafer with protective gas with more stable chemical properties, thereby achieving gas protection.

Common wafer cassette in prior art comprises an upper box, a lower box and an inner box. In particular, the upper box is fitted on the lower box to form a hollow structure, in which the inner box is disposed. In the case of a tight fit between the upper box and the lower box, the whole wafer cassette is nearly sealed, which will lead to the technical problem of poor gas exchange between interior and exterior. Specifically, during the process of vacuuming, the gas inside the wafer cassette cannot flow out fluently, as a result of which the internal pressure is greater than the external pressure, and the wafer cassette is deformed and expanded. During the process of inflation, the gas outside the wafer cassette cannot flow in fluently, as a result of which the external pressure is greater than the internal pressure, and the wafer cassette is compressed and deformed.

Therefore, there is a need to develop a ventilated wafer cassette. The ventilated wafer cassette has at least one ventilation channel connecting the hollow structure with the external environment, and thus solves the technical problem of poor gas exchange between interior and exterior, and preventing deformation of the wafer cassette.

SUMMARY

In an aspect, a ventilated wafer cassette is described.

In particular, the present application provides a ventilated wafer cassette, comprising
an upper box,
a lower box, and
an inner box;
wherein the upper box is fitted on the lower box to form a hollow structure, in which the inner box is disposed;
at least one ventilation channel connecting the hollow structure with an external environment is provided in the upper box, in the lower box or at the connection between the upper box and the lower box.

In a preferred embodiment of the present application, the ventilation channel also has a dustproof function. Specifically, the interior of the ventilation channel is provided with a dustproof labyrinth structure, which promotes the passage of gas while preventing the entry of dust into the ventilation channel. The dustproof labyrinth structure is common dustproof means in the field of mechanical design, which can be embodied to provide a plurality of protrusions or barriers within a gap or passage, such that the inner diameter dimension of the gap or the passage changes continuously along the direction of its length. In this case, when gas passes through the gap or the passage, the continuously varying inner diameter dimension causes a continuous change of the flow rate of the gas, so that the dust settles at a section which has larger inner diameter and slower flow rate, thereby achieving the dustproof purpose.

It should be understood that the terms "bottom face", "top face", "upward", "downward" described herein are defined based on the orientation of the ventilated wafer cassette shown in FIG. 1, that is to say, the bottom face of the upper box is disposed opposite to the top face of the lower box.

It should also be understood that the ventilated wafer cassette of the present application is suitable for containing both semiconductor wafers and other types of sheet-like objects.

The ventilated wafer cassette of the present application has at least one ventilation channel connecting the hollow structure with the external environment, thereby solving the technical problem of poor gas exchange between interior and exterior, and preventing deformation of the wafer cassette.

BRIEF DESCRIPTION OF THE DRAWINGS

The advantages and features of the present application will now be described in details with reference to the accompanying drawings, in which the components are not necessarily drawn to scale, in which.

Figure 1:
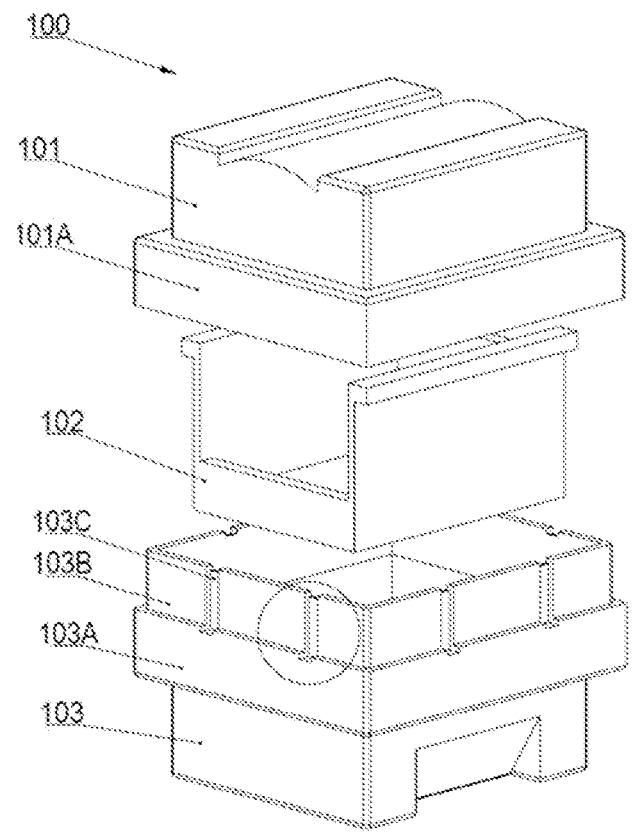
FIG. 1 shows an exploded perspective view of an embodiment of a ventilated wafer cassette 100.

It should be understood that the accompanying drawings are drawn for exemplary purposes only and should not be considered as limitations on the present application.

DETAILED DESCRIPTION

A ventilated wafer cassette comprises
an upper box,
a lower box, and
an inner box;
wherein the upper box is fitted on the lower box to form a hollow structure, in which the inner box is disposed; at least one ventilation channel connecting the hollow structure with an external environment is provided in the upper box, in the lower box or at the connection between the upper box and the lower box.

The present application is suitable for both semiconductor wafers and other parts that require gas protection.

For a ventilated wafer cassette according to the application, preferably, the inner box is in the form of a cuboid box that opens on three sides. The upper box is in the form of a box with an open bottom face, and is provided with a downwardly extending upper box flange. The lower box is in the form of a box with an open top face, and is provided with an upwardly extending lower box lower flange, on which a lower box upper flange which also extends upward is provided. The cross-sectional profile of the lower box lower flange is larger than that of the lower box upper flange, and a stepped structure is formed at an interface between the lower box upper flange and the lower box lower flange. The upper box flange is fitted on the lower box upper flange, with an edge of the upper box flange being placed on the stepped structure formed at the interface between the lower box upper flange and the lower box lower flange, thereby forming the hollow structure.

In a preferred embodiment, the inner box is in the form of a cuboid box that opens on three sides, the interior of which is provided with parallel partitions which are connected to the lateral sides of the inner box at both horizontal ends. Multiple spaces for containing semiconductor wafers or sheet-like objects are formed by means of the partitions, thereby increasing the number of semiconductor wafers or sheet-like objects to be contained. Preferably, the spacings between the partitions are equal. Preferably, the upper edges of the partitions are flush with the edge of the inner box in height. In a preferred embodiment, the distance between the lower edge of each partition (from the lowest position) and the bottom face of the inner box is ¼ to ½, preferably ⅓ to ⅖, of the height of the inner box to save material. It should be noted that, in this specification, the inner box is presented under the circumstances where no partitions are provided, but the arrangement of the partitions is a solution that can be easily implemented by the person skilled in the art after reading this specification.

For the ventilated wafer cassette according to the present application, preferably, the ventilation channel is provided on the fitted structure formed by the upper box flange and the lower box upper flange, and the ventilation channel is formed by an inner circumferential face of the upper box flange and an outer circumferential face of the lower box upper flange together. More preferably, at least one ventilation channel is provided on each of four lateral sides of the fitted structure. The plurality of ventilation channels further promotes the flow of gas, thereby enhancing the technical effect of the application.

For the ventilated wafer cassette according to the present application, preferably, the ventilation channel comprises a straight groove provided in the outer circumferential face of the lower box upper flange or in the inner circumferential face of the upper box flange, which extents vertically through the entire flange. When provided in the outer circumferential face of the lower box upper flange, the straight groove is provided with a notch for facilitating the passage of gas at an edge of the lower box upper flange and at the stepped structure of the interface. When provided in the inner circumferential face of the upper box flange, the straight groove is provided with a notch for facilitating the passage of gas at an edge of the upper box flange and in an inner top face of the upper box flange. More preferably, the straight groove is provided with a plurality of protrusions at the bottom, which are arranged at equal or unequal spacing. The widths of the protrusions are the same as that of the straight groove, and the heights of the protrusions are less than the depth of the straight groove. In this case, the protrusion structures on the straight groove change the inner diameter dimension of the ventilation channel, so that the ventilation channel has a dustproof labyrinth structure, which in turn prevents the entry of dust.

For the ventilated wafer cassette according to the present application, preferably, the ventilation channel comprises a zigzag-shaped groove provided in the outer circumferential face of the lower box upper flange or in the inner circumferential face of the upper box flange, the zigzag-shaped groove has two vertical extension sections and one horizontal extension section, and it extends through the entire flange in vertical direction. When provided in the outer circumferential face of the lower box upper flange, the zigzag-shaped groove is provided with a notch for facilitating the passage of gas at the edge of the lower box upper flange and at the stepped structure of the interface. When provided in the inner circumferential face of the upper box flange, the zigzag-shaped groove is provided with a notch for facilitating the passage of gas at the edge of the upper box flange and in an inner top face of the upper box flange. More preferably, the zigzag-shaped groove is provided with a plurality of protrusions at the bottom, which are arranged at equal or unequal spacings. The widths of the protrusions are the same as that of the zigzag-shaped groove, and the heights of the protrusions are less than the depth of the zigzag-shaped groove. Compared with the embodiment with the straight groove described above, the zigzag-shaped groove provides a greater ventilation channel length, thereby further improving the dustproof performance of the ventilation channel.

In the simplest case, the ventilation channel of the ventilated wafer cassette described in the present application is a straight groove with a flat bottom. Although the ventilated wafer cassette in this configuration has a stronger ventilation performance, it cannot prevent dust from entering the inside of the wafer cassette. For this reason, this present application gives three more embodiments.

The first embodiment of the present application has a straight groove with protrusions. The protrusions form a dustproof labyrinth structure, and thus prevent dust from entering. However, the dustproof performance of the ventilation channel is generally in positive relation to its length. Since the length of the straight groove corresponds to the upper flange, the length of the straight groove cannot be extended arbitrarily. For this reason, if the increase in this length is desired, the second embodiment of the present application may be considered.

The second embodiment differs from the first embodiment mainly in that the ventilation channel comprises a zigzag-shaped groove with a flat bottom. In this case, the length of the ventilation channel can be extended so as to achieve a better dustproof performance. If further enhancement of the dustproof performance of the ventilation channel is desired, the third embodiment of the present application may be considered.

The third embodiment differs from the second embodiment mainly in that the zigzag-shaped groove comprises protrusions. The protrusions form a dustproof labyrinth structure, and thus prevent dust from entering. The ventilation channel of the third embodiment simultaneously has a dustproof labyrinth structure and a relatively long length, which further enhance the dustproof performance of the ventilation channel.

The ventilated wafer cassette of the present application can be manufactured from plastic, metal and other materials, and can be prepared by using common machine-shaping methods. Specifically, the plastic material can be ABS, nylon, polyurethane, etc.; the metal material can be steel, cast iron, aluminum, copper, etc. If a plastic material is adopted, the common machine-shaping methods are injection molding, molding, extrusion molding, and other methods. If a metal material is adopted, the common machine-shaping methods are machining, casting, stamping, bending, and other methods.

In use, semiconductor wafers or other sheet-like objects are placed in the inner box, the inner box is then placed in the lower box, and the upper box is subsequently fitted on the lower box. After that, operations such as air extraction or inflation with protective gas can continue to be implemented.

The following is an exemplary description of the present application in conjunction with the accompanying drawings, wherein the components in the accompanying drawings use plastic as an exemplary material, and are prepared by injection molding, molding, extrusion molding, and other methods.

Figure 2:
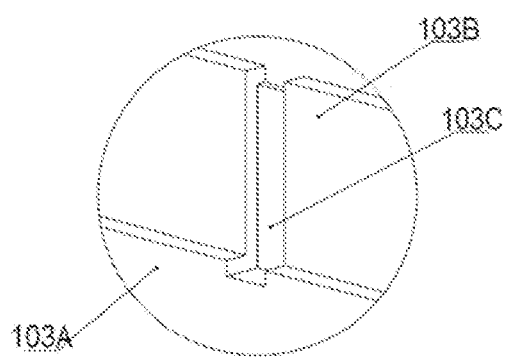
FIG. 2 is a partial view of FIG. 1, which shows details of a straight groove 103C.
Figure 3:
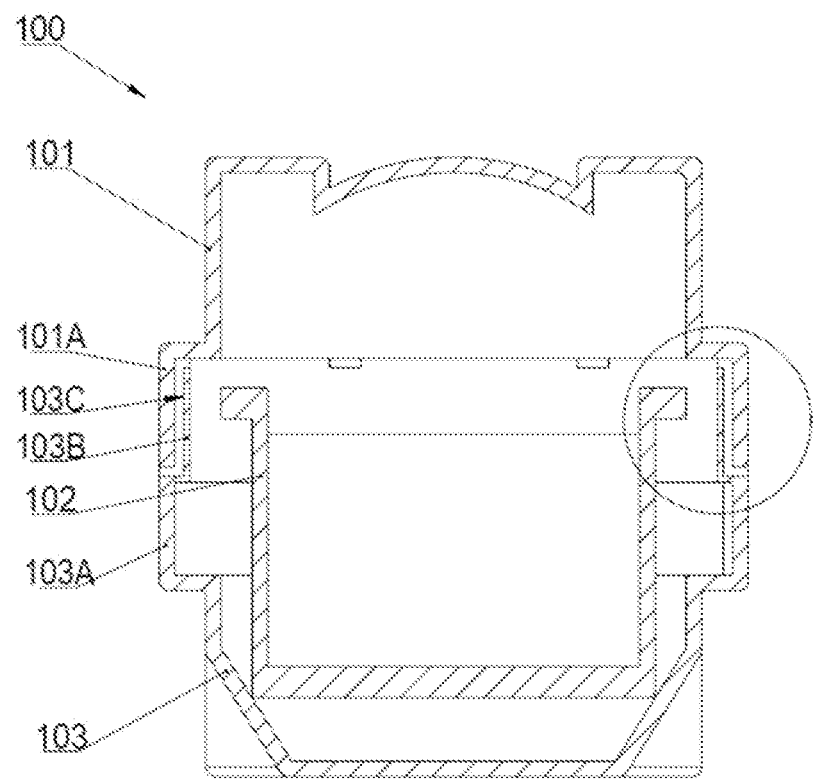
FIG. 3 shows a cross-sectional view of the ventilated wafer cassette 100 shown in FIG. 1 in an assembled state, wherein the ventilated wafer cassette 100 is sectioned along a horizontal plane that passes through a ventilation channel.
Figure 4:
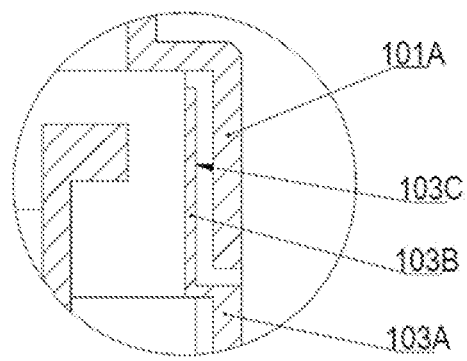
FIG. 4 is a partial view of FIG. 3, which further shows details of the ventilation channel.

FIG. 1 shows an exploded perspective view of an embodiment of a ventilated wafer cassette 100, the ventilated wafer cassette as a whole being represented using numeral 100. In particular, the ventilated wafer cassette 100 comprises an upper box 101, an inner box 102, and a lower box 103. The upper box 101 is in the form of a box with an open bottom face, and is provided with a downwardly extending upper box flange 101A. The lower box 103 is in the form of a box with an open top face, and is provided with an upwardly extending lower box lower flange 103A, on which a lower box upper flange 103B which also extends upward is provided. The cross-sectional profile of the lower box lower flange 103A is larger than that of the lower box upper flange 103B, and a stepped structure is formed at an interface between the lower box upper flange 103B and the lower box lower flange 103A. The upper box flange 101A is fitted on the lower box upper flange 103B, with an edge of the upper box flange 101A being placed on the stepped structure formed at the interface between the lower box upper flange 103B and the lower box lower flange 103A, thereby forming a hollow structure, in which the inner box 102 is disposed. In addition, an outer circumferential face of the lower box upper flange 103B is provided with a straight groove 103C which extents vertically through the entire flange. It should be understood that, although each of lateral faces of the lower box upper flange 103B is provided with two straight grooves 103C in this embodiment, it is also conceivable to provide more or fewer straight grooves 103C. FIG. 2 is a partial view of FIG. 1, which shows details of the straight groove 103C. As shown in FIG. 2, the straight groove 103C has a flat bottom, and the straight groove 103C is provided with a notch for facilitating the passage of gas at an edge of the lower box upper flange 103B and at the stepped structure of the interface. FIG. 3 shows a cross-sectional view of the ventilated wafer cassette 100 shown in FIG. 1 in an assembled state, wherein the ventilated wafer cassette 100 is sectioned along a horizontal plane that passes through a ventilation channel. As shown in FIG. 3, the ventilation channel of the ventilated wafer cassette 100 is formed by the straight groove 103C located in an outer circumferential face of the lower box upper flange 103B and an inner circumferential face of the upper box flange 101A together. FIG. 4 is a partial view of FIG. 3, which further shows details of the ventilation channel. As shown in FIG. 4, the ventilation channel enables the communication between the interior and exterior of the ventilated wafer cassette 100, allowing gas to easily flow into or flow out of the ventilated wafer cassette 100.

Figure 5:
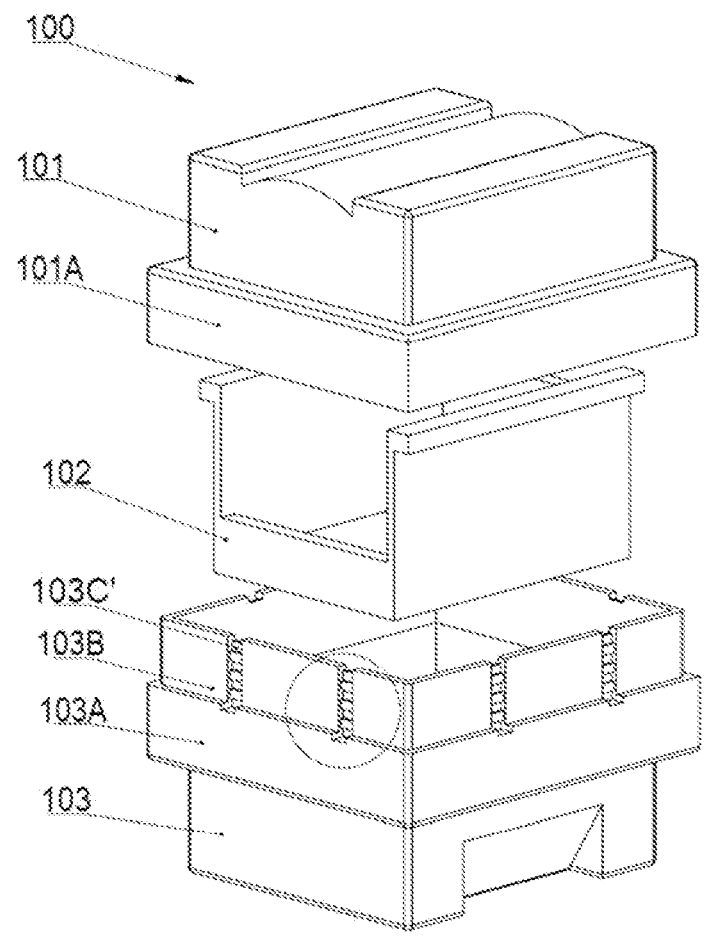
FIG. 5 shows an exploded perspective view of another embodiment of the ventilated wafer cassette 100.
Figure 6:
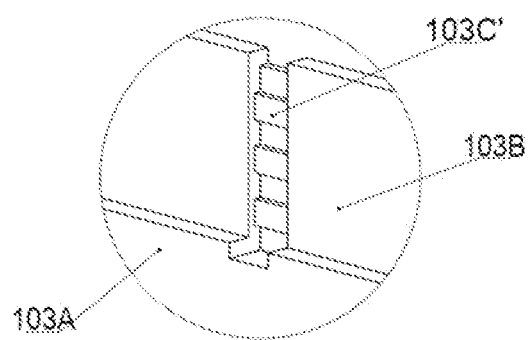
FIG. 6 is a partial view of FIG. 5, which shows details of a straight groove 103C'.
Figure 7:
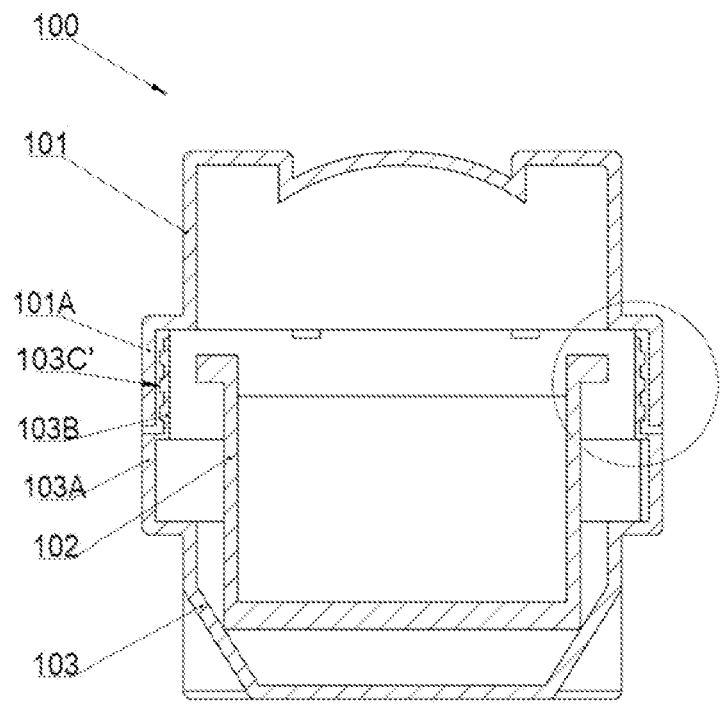
FIG. 7 shows a cross-sectional view of the ventilated wafer cassette 100 shown in FIG. 5 in an assembled state, wherein the ventilated wafer cassette 100 is sectioned along a horizontal plane that passes through the ventilation channel.
Figure 8:
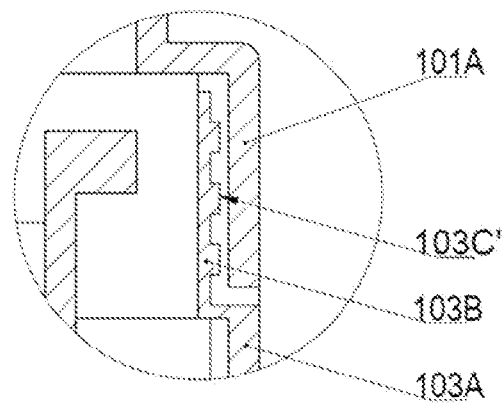
FIG. 8 is a partial view of FIG. 7, which further shows details of the ventilation channel.

FIG. 5 shows an exploded perspective view of another embodiment of the ventilated wafer cassette 100. It should be understood that, the technical features of this embodiment that are the same as those of the embodiment shown in FIG. 1 will not be repeated. The embodiment shown in FIG. 5 differs from the embodiment shown in FIG. 1 mainly in that a straight groove 103C' is provided with protrusions at the bottom. FIG. 6 is a partial view of FIG. 5, which shows details of the straight groove 103C'. As shown in FIG. 6, the protrusions are three rectangular protrusions extending from the bottom of the straight groove 103C'. The rectangular protrusions are arranged at equal spacing, the widths of which are as same as that of the straight groove 103C', and the heights of which are less than the depth of the straight groove 103C'. FIG. 7 shows a cross-sectional view of the ventilated wafer cassette 100 shown in FIG. 5 in an assembled state, wherein the ventilated wafer cassette 100 is sectioned along a horizontal plane that passes through the ventilation channel. Similarly, as shown in FIG. 7, the ventilation channel of the ventilated wafer cassette 100 is formed by the straight groove 103C' which is located in the outer circumferential face of the lower box upper flange 103B and the inner circumferential face of the upper box flange 101A together. FIG. 8 is a partial view of FIG. 7, which further shows details of the ventilation channel. As shown in FIG. 8, the ventilation channel communicates the interior with the exterior of the ventilated wafer cassette 100, and the rectangular protrusion structures on the straight groove 103C' also change the inner diameter dimension of the ventilation channel, which make the ventilation channel have a dustproof labyrinth structure, thus achieving the function of preventing dust from entering.

Figure 9:
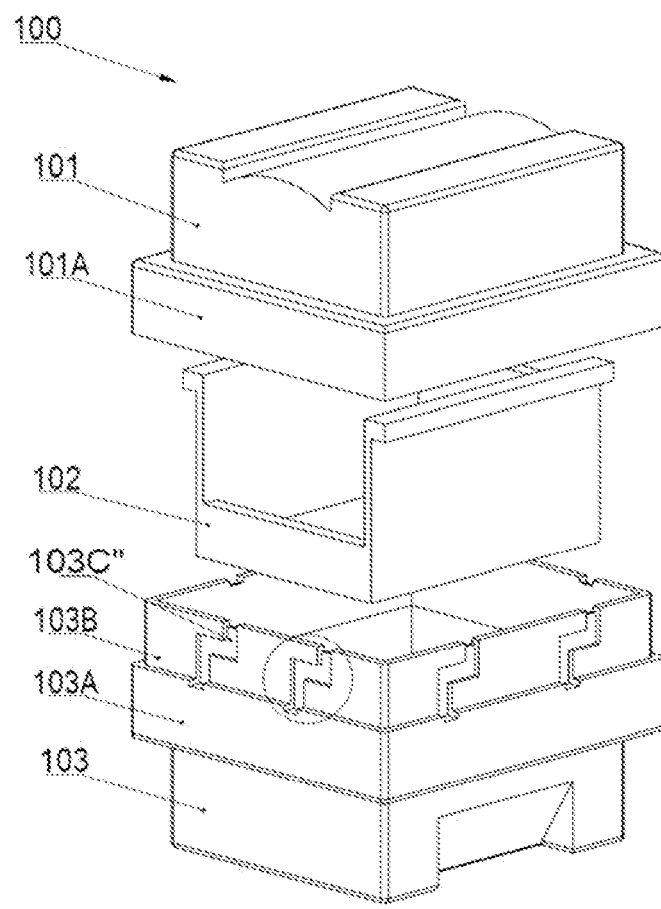
FIG. 9 shows an exploded perspective view of another embodiment of the ventilated wafer cassette 100.
Figure 10:
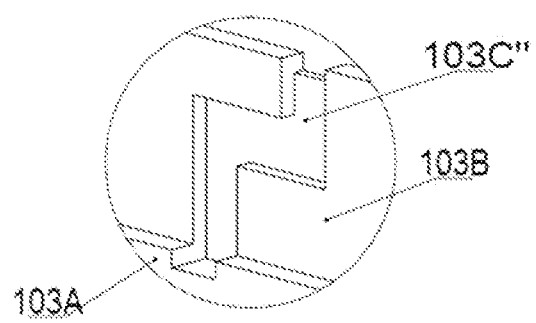
FIG. 10 is a partial view of FIG. 9, which shows details of a zigzag-shaped groove 103C".

FIG. 9 shows an exploded perspective view of another embodiment of the ventilated wafer cassette 100. It should be understood that, the technical features of this embodiment that are the same as those of the embodiment shown in FIG. 1 will not be repeated. The embodiment shown in FIG. 9 differs from the embodiment shown in FIG. 1 mainly in that the ventilated wafer cassette 100 has a zigzag-shaped groove 103C" with a flat bottom, instead of a straight groove. FIG. 10 is a partial view of FIG. 9, which shows details of a zigzag-shaped groove 103C". As shown in FIG. 10, the zigzag-shaped groove 103C" has two vertical extension sections and one horizontal extension section, and it extends through the entire lower box upper flange 103B in vertical direction. This can extend the length of the ventilation channel, thereby improving the dustproof performance of the ventilated wafer cassette 100.

Figure 11:
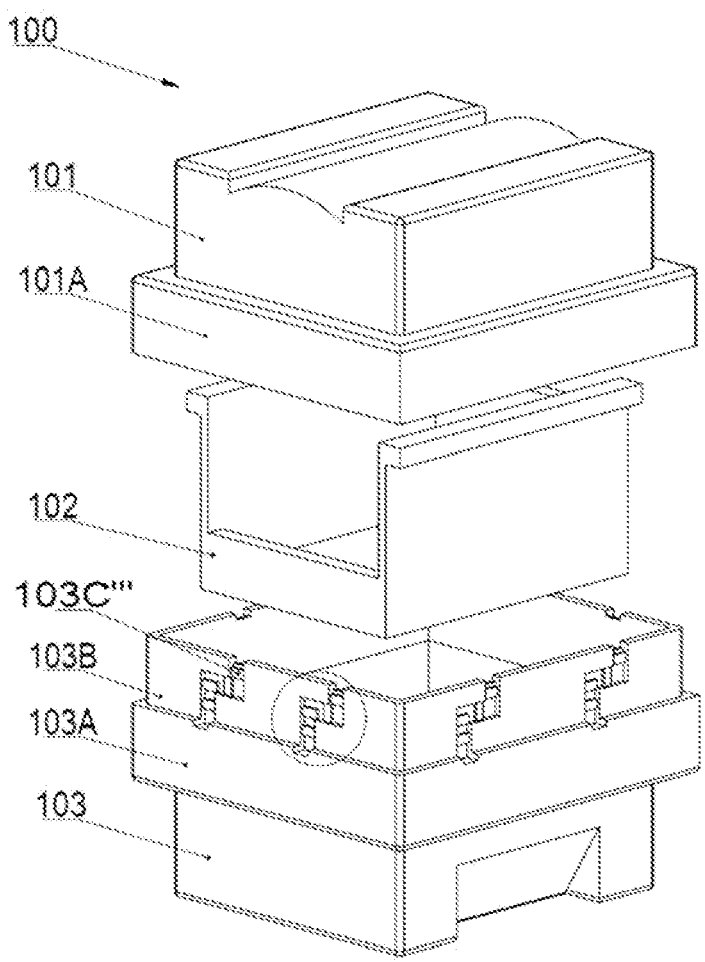
FIG. 11 shows an exploded perspective view of yet another embodiment of the ventilated wafer cassette 100.
Figure 12:
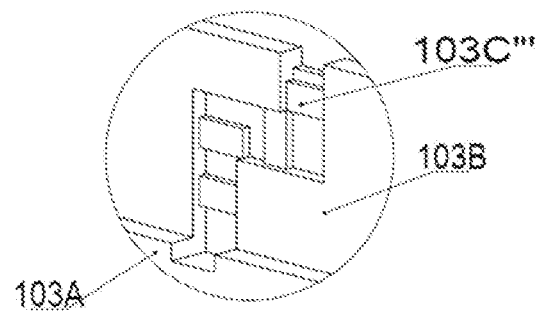
FIG. 12 is a partial view of FIG. 11, which shows details of a zigzag-shaped groove 103C'".

FIG. 11 shows an exploded perspective view of yet another embodiment of the ventilated wafer cassette 100. It should be understood that, the technical features of this embodiment that are the same as those of the embodiment shown in FIG. 9 will not be repeated. The embodiment shown in FIG. 11 differs from the embodiment shown in FIG. 9 mainly in that a zigzag-shaped groove 103C''' is provided with four protrusions at the bottom. FIG. 12 is a partial view of FIG. 11, which shows details of the zigzag-shaped groove 103C'''. As shown in FIG. 12, the two vertical extension sections of the zigzag-shaped groove 103C''' are provided with three rectangular protrusions in total, and the horizontal extension section of the zigzag-shaped groove 103C''' is provided with one rectangular protrusion. The widths of the rectangular protrusions are the same as that of the zigzag-shaped groove 103C''', and the heights of the rectangular protrusions are less than the depth of the zigzag-shaped groove 103C'''. The rectangular protrusion structure changes the inner diameter dimension of the ventilation channel, which makes the ventilation channel have a dust-proof labyrinth structure, thus achieving the function of preventing dust from entering.

It should also be understood that, although the zigzag-shaped groove or the straight groove is provided in the outer circumferential face of the lower box upper flange in the embodiments depicted by the figures above, the zigzag-shaped groove or the straight groove can be provided in a similarly way in the inner circumferential face of the upper box flange. In practice, the zigzag-shaped groove or the straight groove can be provided only on one of the lower and upper boxes.

The above is only an exemplary description of the present application, and is not intended to impose any formal limitation on the present application. Any simple modification, equivalent change, combination or variation made to the above embodiments in accordance with the technical essence of the present application still falls within the protection scope of the technical solution of the present application.

The invention claimed is:

1. A ventilated wafer cassette, comprising:
an upper box,
a lower box, and
an inner box;
wherein the upper box is fitted on the lower box to form a hollow structure, in which the inner box is disposed; at least one ventilation channel connecting the hollow structure with an external environment is provided in the upper box, in the lower box or at the connection between the upper box and the lower box,
wherein the inner box is in the form of a cuboid box that opens on three sides; the upper box is in the form of a box with an open bottom face, and is provided with a downwardly extending upper box flange; the lower box is in the form of a box with an open top face, and is provided with an upwardly extending lower box lower flange, on which a lower box upper flange which also extends upward is provided; the cross-sectional profile of the lower box lower flange is larger than that of the lower box upper flange, and a stepped structure is formed at an interface between the lower box upper flange and the lower box lower flange; the upper box flange is fitted on the lower box upper flange, with an edge of the upper box flange being placed on the stepped structure formed at the interface between the lower box upper flange and the lower box lower flange, thereby forming the hollow structure,
wherein the ventilation channel is provided on a fitted structure formed by the upper box flange and the lower box upper flange, the ventilation channel is formed by an inner circumferential face of the upper box flange and an outer circumferential face of the lower box upper flange together, and
wherein the ventilation channel comprises a straight groove provided in the outer circumferential face of the lower box upper flange or in the inner circumferential face of the upper box flange, which extents vertically through the entire flange; when provided in the outer circumferential face of the lower box upper flange, the straight groove is provided with a notch for facilitating the passage of gas at an edge of the lower box upper flange and at the stepped structure of the interface; when provided in the inner circumferential face of the upper box flange, the straight groove is provided with a notch for facilitating the passage of gas at an edge of the upper box flange and in an inner top face of the upper box flange.

2. A ventilated wafer cassette, comprising:
an upper box,
a lower box, and
an inner box;
wherein the upper box is fitted on the lower box to form a hollow structure, in which the inner box is disposed; at least one ventilation channel connecting the hollow structure with an external environment is provided in the upper box, in the lower box or at the connection between the upper box and the lower box,
wherein the inner box is in the form of a cuboid box that opens on three sides; the upper box is in the form of a box with an open bottom face, and is provided with a downwardly extending upper box flange; the lower box is in the form of a box with an open top face, and is provided with an upwardly extending lower box lower flange, on which a lower box upper flange which also extends upward is provided; the cross-sectional profile of the lower box lower flange is larger than that of the lower box upper flange, and a stepped structure is formed at an interface between the lower box upper flange and the lower box lower flange; the upper box flange is fitted on the lower box upper flange, with an edge of the upper box flange being placed on the stepped structure formed at the interface between the lower box upper flange and the lower box lower flange, thereby forming the hollow structure,
wherein the ventilation channel is provided on a fitted structure formed by the upper box flange and the lower box upper flange, the ventilation channel is formed by an inner circumferential face of the upper box flange and an outer circumferential face of the lower box upper flange together,
wherein at least one ventilation channel is provided on each of four lateral sides of the fitted structure, and
wherein the ventilation channel comprises a straight groove provided in the outer circumferential face of the lower box upper flange or in the inner circumferential face of the upper box flange, which extents vertically through the entire flange; when provided in the outer circumferential face of the lower box upper flange, the straight groove is provided with a notch for facilitating the passage of gas at an edge of the lower box upper flange and at the stepped structure of the interface; when provided in the inner circumferential face of the upper box flange, the straight groove is provided with a notch for facilitating the passage of gas at an edge of the upper box flange and in an inner top face of the upper box flange.

* * * * *